United States Patent
Lee et al.

(10) Patent No.: US 11,392,047 B2
(45) Date of Patent: Jul. 19, 2022

(54) DISPLAY DEVICE AND MANUFACTURING METHOD THEREOF

(71) Applicant: Samsung Display Co., Ltd., Yongin-si (KR)

(72) Inventors: Hyun Wook Lee, Asan-si (KR); Soon Wook Hong, Anyang-si (KR); Seung Rae Kim, Cheonan-si (KR); Jae-Hyun Park, Yongin-si (KR); Min cheol Chae, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/355,089

(22) Filed: Jun. 22, 2021

(65) Prior Publication Data

US 2021/0318623 A1  Oct. 14, 2021

Related U.S. Application Data

(62) Division of application No. 16/418,945, filed on May 21, 2019, now Pat. No. 11,079,689.

(30) Foreign Application Priority Data

Oct. 22, 2018 (KR) ........................ 10-2018-0125943

(51) Int. Cl.
*G03F 7/20* (2006.01)
*G03F 9/00* (2006.01)

(52) U.S. Cl.
CPC ...... *G03F 7/70683* (2013.01); *G03F 7/70625* (2013.01); *G03F 7/70633* (2013.01); *G03F 9/7084* (2013.01)

(58) Field of Classification Search
CPC ........... G02F 1/13625; G02F 1/136295; G02F 1/1333; G02F 1/133354; G03F 7/70475;
(Continued)

(56) References Cited

U.S. PATENT DOCUMENTS

| 7,982,273 B2 | 7/2011 | Chen et al. |
| 2002/0001083 A1 | 1/2002 | Tabei |

(Continued)

FOREIGN PATENT DOCUMENTS

| JP | 2008-537642 | 9/2008 |
| KR | 10-2002-0046286 | 6/2002 |

(Continued)

OTHER PUBLICATIONS

Non-Final Office Action dated Feb. 20, 2020, in U.S. Appl. No. 16/418,945.

(Continued)

*Primary Examiner* — Peter B Kim
(74) *Attorney, Agent, or Firm* — H.C. Park & Associates, PLC

(57) ABSTRACT

A method of manufacturing a display device including: preparing a substrate having a display area and a non-display area; and forming an alignment mark disposed in the non-display area of the substrate. The alignment mark includes a quadrangular-shaped center portion and a plurality of measurement portions that surround the center portion, the plurality of measurement portions including four or more measurement portions, and each of the measurement portions including sides that are parallel with two sides of the quadrangular-shaped center portion.

9 Claims, 23 Drawing Sheets

(58) Field of Classification Search
CPC .............. G03F 7/70625; G03F 7/70633; G03F 7/70683; G03F 7/70433; G03F 1/00; G03F 9/7084; G03F 9/7003; H01L 23/544; H01L 27/3244; H01L 21/67282; H01L 2223/54426
See application file for complete search history.

(56) References Cited

U.S. PATENT DOCUMENTS

| | | | |
|---|---|---|---|
| 2003/0021465 A1 | 1/2003 | Adel et al. | |
| 2008/0157082 A1 | 7/2008 | Yang et al. | |
| 2008/0242043 A1* | 10/2008 | Yang | G03F 7/70633 438/401 |
| 2017/0357154 A1 | 12/2017 | Oh et al. | |
| 2018/0130845 A1* | 5/2018 | Ko | H01L 22/30 |

FOREIGN PATENT DOCUMENTS

| | | |
|---|---|---|
| KR | 10-2005-0069571 | 7/2005 |
| KR | 10-2016-0132191 | 11/2016 |

OTHER PUBLICATIONS

Non-Final Office Action dated Jul. 21, 2020, in U.S. Appl. No. 16/418,945.
Notice of Allowance dated Mar. 22, 2021, in U.S. Appl. No. 16/418,945.

* cited by examiner

FIG. 11
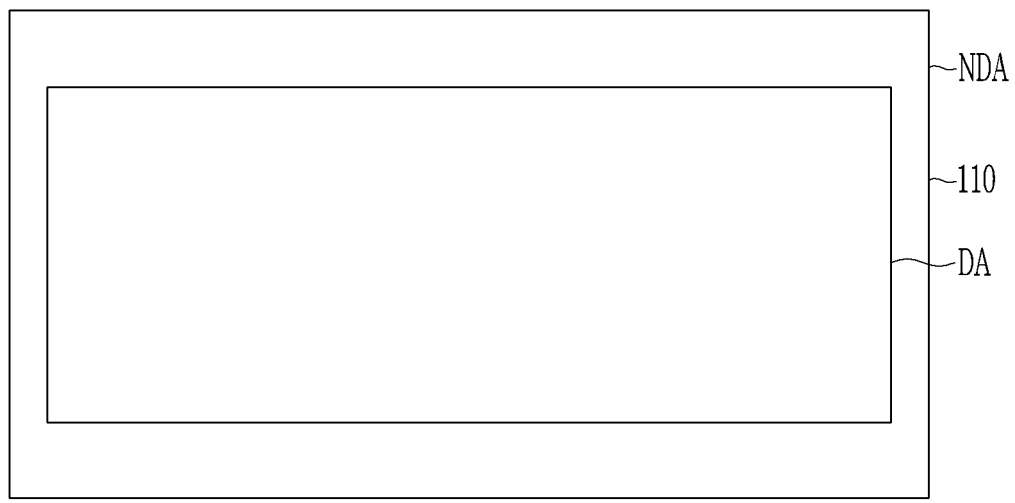
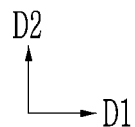

DISPLAY DEVICE AND MANUFACTURING METHOD THEREOF

CROSS-REFERENCE TO RELATED APPLICATION

This application is a Division of U.S. patent application Ser. No. 16/418,945 filed on May 21, 2019, which claims priority from and the benefit of Korean Patent Application No. 10-2018-0125943, filed on Oct. 22, 2018, each of which is hereby incorporated by reference for all purposes as if fully set forth herein.

BACKGROUND

Field

Exemplary embodiments of the invention relate generally to a display device and a method for manufacturing the same, and more specifically, to a display device that includes an alignment mark that can measure misalignment of a mask, and a method for manufacturing the display device.

Discussion of the Background

Flat panel displays which are currently in use include a liquid crystal display (LCD), a plasma display panel (PDP), an organic light emitting diode (OLED) device, a field effect display (FED), an electrophoretic display (EPD) device, and the like.

During a process for forming such a flat display device, various patterns are formed and an exposure device is used to form the patterns. The exposure device exposes an object according to a pattern formed in a pattern mask.

However, as the display device is enlarged, since the size of the pattern mask is limited, it becomes more difficult to expose the display substrate at one time by the pattern mask. Thus, a method for exposing the display device by sequentially aligning masks on the display device is used.

The above information disclosed in this Background section is only for understanding of the background of the inventive concepts, and, therefore, it may contain information that does not constitute prior art.

SUMMARY

Exemplary embodiments of the present invention provide a display device that includes alignment marks that can measure misalignment of the masks, and a method for manufacturing the same.

Additional features of the inventive concepts will be set forth in the description which follows, and in part will be apparent from the description, or may be learned by practice of the inventive concepts.

An exemplary embodiment of the present invention provides: a substrate that has display area and a non-display area; and an alignment mark that is disposed in the non-display area of the substrate. The alignment mark includes a quadrangular-shaped center portion and a plurality of measurement portions that surround the center portion, the plurality of measurement portions including four or more measurement portions, and each of the measurement portions includes sides that are parallel with two sides of the quadrangular-shaped center portion.

One or more alignment marks may be disposed between the ¼ point and the ¾ point of the non-display area in a first direction.

The plurality of measurement portions may include: a first measurement portion that includes sides that are parallel with a first side and a fourth side of the quadrangular-shaped center portion and is disposed adjacent to the first side and the fourth side; a second measurement portion that includes sides that are parallel with the first side and a second side of the quadrangular-shaped center portion and is disposed adjacent to the first side and the second side; a third measurement portion that includes sides that are parallel with the second side and a third side of the quadrangular-shaped center portion and is disposed adjacent to the second side and the third side; and a fourth measurement portion that includes sides that are parallel with the third side and the fourth side of the quadrangular-shaped center portion and is disposed adjacent to the third side and the fourth side.

A difference between a value obtained by subtracting a distance from the center portion to the third measurement portion in a second direction from a distance from the center portion to the first measurement portion in the second direction, and a value obtained by subtracting a distance from the center portion to the fourth measurement portion in the second direction from a distance from the center portion to the second measurement portion in the second direction, may be about −0.8 µm to about 0.8 µm.

A difference between a value obtained by subtracting a distance from the center portion to the third measurement portion in the first direction from a distance from the center portion to the first measurement portion in the first direction, and a value obtained by subtracting a distance from the center portion to the fourth measurement portion in the first direction from a distance from the center portion to the second measurement portion in the first direction, may be about −0.8 µm to 0.8 µm.

The center portion and the measurement portions may include different materials.

The center portion may include the same material as a gate line in the display area, and the measurement portions may include the same material as a data line in the display area or the same material as a pixel electrode in the display area.

The center portion may include the same material as a data line of the display area, and the measurement portions may include the same material as a pixel electrode of the display area.

The display device may further include a plurality of drivers that are disposed in the non-display area, wherein the alignment marks may be disposed between the plurality of drivers.

The non-display area may include an area where two or more masks are overlapped with each other during a manufacturing process, and the alignment mark may be disposed in the mask-overlapped area.

A horizontal length of the alignment mark may be about 15 µm to about 30 µm.

A vertical length of the alignment mark may be about 15 µm to about 30 µm.

Another exemplary embodiment of the present invention provides: a substrate having a display area and a non-display area; and an alignment mark that is disposed in the non-display area of the substrate. The alignment mark includes a quadrangular-shaped center portion and a plurality of measurement portions that surround the center portion, one or more alignment marks are disposed between the ¼ point and the ¾ point of the non-display area in the first direction, and the center portion and the measurement portions of the alignment mark include different materials.

The measurement portions may include: a first measurement portion formed in the shape of a quadrangular ring that surrounds the quadrangular-shaped center portion; and a second measurement portion formed in the shape of a quadrangular ring that surrounds the first measurement portion.

The measurement portions may include: a second measurement portion and a third measurement portion disposed on a virtual straight line that is in parallel with a first side of the quadrangular-shaped center portion, and are disposed apart from each other; a fourth measurement portion and a fifth measurement portion disposed on a virtual straight line that is in parallel with a second side of the quadrangular-shaped center portion, and are disposed apart from each other; a sixth measurement portion and a seventh measurement portion disposed on a virtual straight line that is in parallel with a third side of the quadrangular-shaped center portion, and are disposed apart from each other; and an eighth measurement portion and a first measurement portion disposed on a virtual straight line that is in parallel with a fourth side of the quadrangular-shaped center portion, and are disposed apart from each other.

The measurement portions may include: a fifth measurement portion disposed in parallel with a first side of the quadrangular-shaped center portion and a first measurement portion disposed between the first side and the fifth measurement portion; a sixth measurement portion disposed in parallel with a second side of the quadrangular-shaped center portion and a second measurement portion disposed between the second side and the sixth measurement portion; and an eighth measurement portion disposed in parallel with a fourth side of the quadrangular-shaped center portion and a fourth measurement portion disposed between the fourth side and the eighth measurement portion.

The display device may further include a plurality of drivers that are disposed in the non-display area, wherein the alignment marks may be disposed between the plurality of drivers.

The non-display area may include an area where two or more masks are overlapped with each other during a manufacturing process, and the alignment mark may be disposed in the mask-overlapped area.

The center portion may include the same material as a gate line or a data line of the display area, and the measurement portions may include the same material as the data line of the display area or a pixel electrode of the display area.

Another exemplary embodiment of the present invention provides a method of manufacturing a display device, including: preparing a substrate to have a display area and a non-display area; forming a center portion disposed in the non-display area at the same time through the same process as a process for forming a first conductive layer in the display area; forming a second conductive layer in the display area by using a first mask, and forming a first measurement portion and a second measurement portion that surround the center portion through the same process as a process for forming the second conductive layer; and forming the second conductive layer by using a second mask in the display area, and forming a third measurement portion and a fourth measurement portion that surround the center portion through the same process as a process for forming the second conductive layer. The center portion is formed in an area where the first mask and the second mask are overlapped with each other.

The center portion may be formed in the shape of a quadrangle, the first measurement portion may include sides that are in parallel with a first side and a second side of the quadrangular-shaped center portion, and may be disposed adjacent to the first side and the fourth side, the second measurement portion may include sides that are in parallel with the first side and a second side of the quadrangular-shaped center portion, and may be disposed adjacent to the first side and the second side, the third measurement portion may include sides that are in parallel with the second side and a third side of the quadrangular-shaped center portion, and may be disposed adjacent to the second side and the third side, and the third measurement portion may include sides that are in parallel with the third side and the fourth side of the quadrangular-shaped center portion, and may be disposed adjacent to the third side and the fourth side.

The center portion and the measurement portions may include different materials.

The center portion may include the same material as a gate line or a data line of the display area, and the measurement portions may include the same material as the data line or a pixel electrode material of the display area.

A difference between a value obtained by subtracting a distance from the center portion to the third measurement portion in a second direction from a distance from the center portion to the first measurement portion in the second direction, and a value obtained by subtracting a distance from the center portion to the fourth measurement portion in the second direction from a distance from the center portion to the second measurement portion in the second direction, may be about −0.8 μm to about 0.8 μm.

A difference between a value obtained by subtracting a distance from the center portion to the third measurement portion in a first direction from a distance from the center portion to the first measurement portion in the first direction, and a value obtained by subtracting a distance from the center portion to the fourth measurement portion in the first direction from a distance from the center portion to the second measurement portion in the first direction, may be about −0.8 μm to about 0.8 μm.

According to the exemplary embodiments, a display device that includes alignment marks that can measure misalignment of masks, and a method for manufacturing the same can be provided.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 11, 12, 13, 14, and 15 are cross-sectional views of a manufacturing process of a display device according to an exemplary embodiment of the present invention.

DETAILED DESCRIPTION

Figure 1:
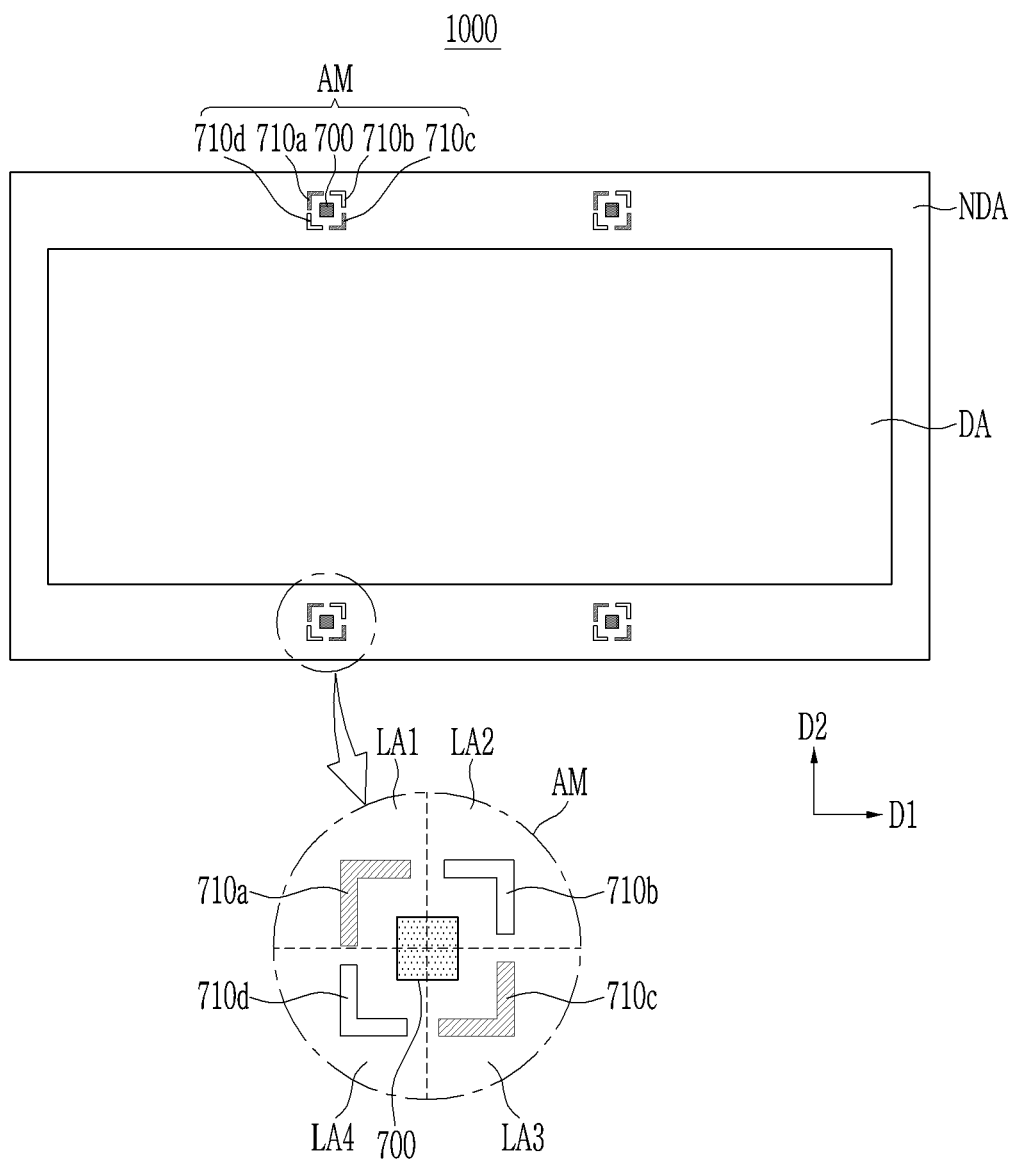
FIG. 1 schematically illustrates a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In addition, in this specification, the phrase "on a plane" means viewing a target portion from the top, and the phrase "on a cross-section" means viewing a cross-section formed by vertically cutting a target portion from the side.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment of the present invention will be described with reference to the accompanying drawings.

FIG. 1 schematically shows a display device according to an exemplary embodiment of the present invention. Referring to FIG. 1, a display panel 1000 of a display device according to an exemplary embodiment of the present invention includes a display area DA and a non-display area NDA. The display area DA is an area where a plurality of pixels including a pixel electrode connected with a transistor are disposed to display an image, and the non-display area NDA is an area where a driver and the like are disposed and thus, no image is displayed. Referring to FIG. 1, the display device according to the exemplary embodiment of the present invention includes one or more alignment marks AM.

In FIG. 1, the alignment marks AM are disposed close to opposite edges of the display area DA in a second direction D2, but this is not restrictive, and the alignment marks Am may be disposed only at one edge of the display area DA. In FIG. 1, two alignment marks AM are disposed in an upper portion and two alignment marks AM are disposed in a lower portion while disposing the display area DA therebetween, but this is just an example. The number of alignment marks AM may be changed depending on a number of masks used to form one layer (e.g., a pixel electrode) in the display area DA. When two masks are used in manufacturing of one layer in the display area DA, one or two alignment marks AM may be located, and this will be described in detail later. In addition, when three masks are used to form one layer of a display device, two to four alignment marks AM may be located. That is, when n masks are used to form one layer of the display device, n−1 to 2*(n−1) alignment marks may be located. The alignment mark may be located in an area where masks are overlapped with each other in manufacturing of the display area, and this will be described in detail later. A specific location relationship of the alignment marks AM will be described in more detail later.

Referring to FIG. 1, the alignment mark AM includes a quadrangular-shaped center portion 700 and a plurality of measurement portions 710a, 710b, 710c, and 710d that are disposed while surrounding the center portion 700. The measurement portions may include a first measurement portion 710a, a second measurement portion 710b, a third measurement portion 710c, and a fourth measurement portion 710d.

Each of the measurement portions is disposed at a distance from the center portion 700. The center portion 700 can divide the alignment mark AM into a first quadrant LA1, a second quadrant LA2, a third quadrant LA3, and a fourth quadrant LA4 with virtual vertical and horizontal lines that cross the center of the quadrangular-shaped center portion 700. In this case, the first measurement portion 710a may be disposed in the first quadrant LA1, the second measurement portion 710b may be disposed in the second quadrant LA2, the third measurement portion 710c may be disposed in the third quadrant LA3, and the fourth measurement portion 710d may be disposed in the fourth quadrant LA4.

The first measurement portion 710a includes sides that are in parallel with two sides of the quadrangular-shaped center portion 700. That is, the first measurement portion 710a includes a side that is in parallel with the first direction and a side that is in parallel with a second direction D2 that is perpendicular to the first direction D1. The side of the first measurement portion 710a, in parallel with the first direction D1, and the side of the first measurement portion 710a, in parallel with the second direction D2, may meet at a corner with a right angle. Similarly, the second measurement portion 710b, the third measurement portion 710c, and the fourth measurement portion 710d each includes a side in parallel with the first direction D1 and a side in parallel with the second direction D2 with respect to the quadrangular-shaped center portion 700.

More specifically, the first measurement portion 710a includes sides that are in parallel with a first side and a fourth side of the quadrangular-shaped center portion 700, and may be disposed adjacent to the first side and the fourth side of the center portion 700. The second measurement portion 710b includes sides that are in parallel with the first side and a second side of the quadrangular-shaped center portion 700, and may be disposed adjacent to the first side and the second side of the center portion 700. The third measurement portion 710c includes sides that are in parallel with the second side and a third side of the quadrangular-shaped center portion 700, and may be disposed adjacent to the second side and the third side of the center portion 700. The fourth measurement portion 710d includes sides that are in parallel with the third side and the fourth side of the quadrangular-shaped center portion 700, and may be disposed adjacent to the third side and the fourth side of the center portion 700.

Alignment of a mask can be determined in a manufacturing process by comparing distances between the respective measurement portions 710a, 710b, 710c, and 710d and the quadrangle of the center portion 700. A detailed alignment determination method will be described later.

In each alignment mark AM, the center portion 700 and the measurement portions 710a, 710b, 710c, and 710d may include different materials. For example, the center portion 700 may include the same material as a gate line of the display area DA, and the measurement portions 710a, 710b, 710c, and 710d may include the same material as a gate line of the display area DA. Alternatively, the center portion 700 may include the same material as the gate line or the data line of the display area DA, and the measurement portions 710a, 710b, 710c, and 710d may include the same material as a pixel electrode of the display area DA.

That is, the center portion 700 and the measurement portions 710a, 710b, 710c, and 710d are formed in different stages, and the center portion 700 may be formed earlier than the measurement portions 710a, 710b, 710c, 710d.

As described, alignment of the mask can be determined during a process for forming the display area DA by using a plurality of masks through the alignment mark AM that includes the center portion 700 and the measurement portions 710a, 710b, 710c, and 710d. Accordingly, misalignment of the mask during the manufacturing process can be accurately measured and corrected.

Figure 2:
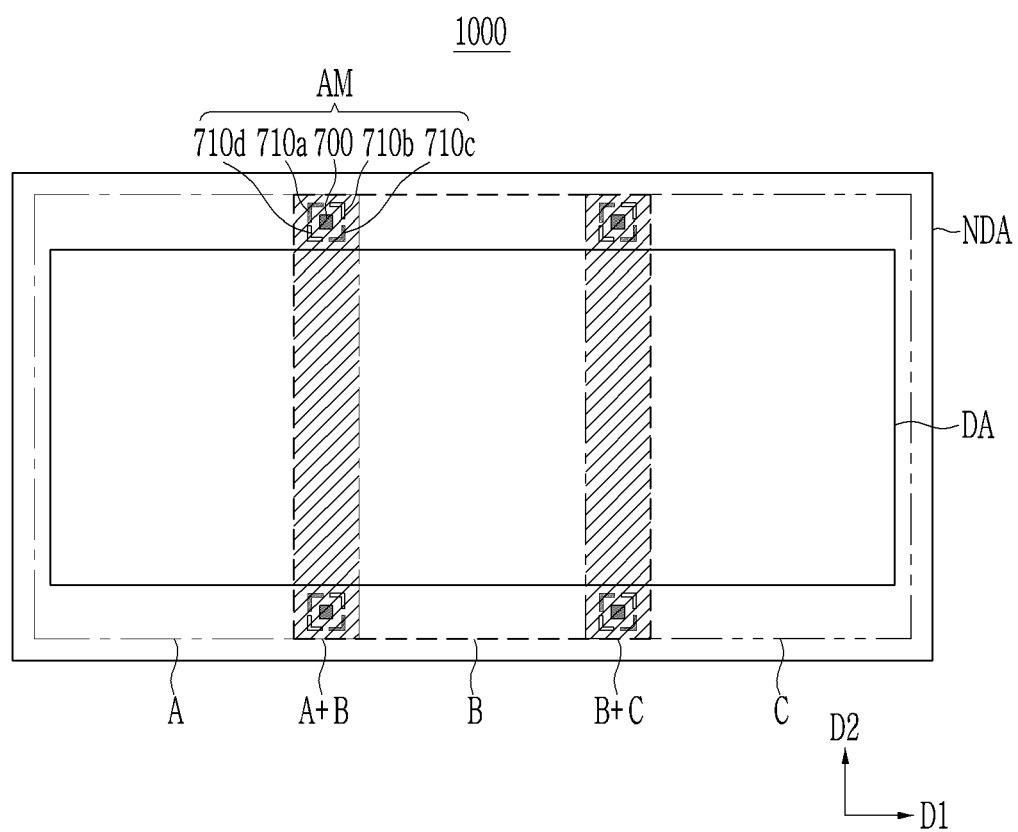
FIG. 2 shows a configuration that uses a plurality of masks during a manufacturing process of a display panel.

FIG. 2 shows a configuration in which a plurality of masks are used during a manufacturing process of the display panel. In case of a display panel of which a display area DA is large, it is difficult to form layers (e.g., a gate line, a data line, a pixel electrode, and the like) that form the display area DA with a single mask. Thus, the respective layers can be formed by applying the plurality of masks sequentially to different areas.

As shown in FIG. 2, one layer can be patterned by using a first mask A, a second mask B, and a third mask C. In this case, an area where the respective masks A, B, and C are overlapped is formed. In FIG. 2, areas marked by A+B and B+C are areas where the masks are overlapped with each other, and these areas are patterned two times by different masks.

In this case, when the first mask A and the second mask B are misaligned in the overlapped area (e.g., A+B), a failure in a structure in the display area DA may occur. That is, the overlapped area is exposed two times, by the first mask A and the second mask B, and when the first mask A and the second mask B are misaligned, a short-circuit may occur or a pixel electrode cannot be normally formed in the overlapped area.

Thus, it is important to maintain alignment of the masks in the overlapped area, and for this, it is important to accurately measure the degree of misalignment in each mask alignment and patterning process. However, it is not easy to accurately measure misalignment of the mask, and it is not easy to determine in which direction the mask is misaligned and how much the mask is misaligned by analyzing a structure of a final manufactured display panel.

However, the display device according to the present exemplary embodiment includes an alignment mark AM that is simultaneously formed through a patterning process using each mask, and an alignment error of the mask can be accurately calculated by measuring a distance between the center portion 700 and measurement portions 710a, 710b, 710c, and 710d of the alignment mark AM.

As shown in FIG. 2, the alignment marks AM are disposed at areas where the masks are overlapped with each other (e.g., A+B, B+C) because each portion of the alignment mark AM is formed simultaneously through a pattern forming process by a different mask.

Figure 3:
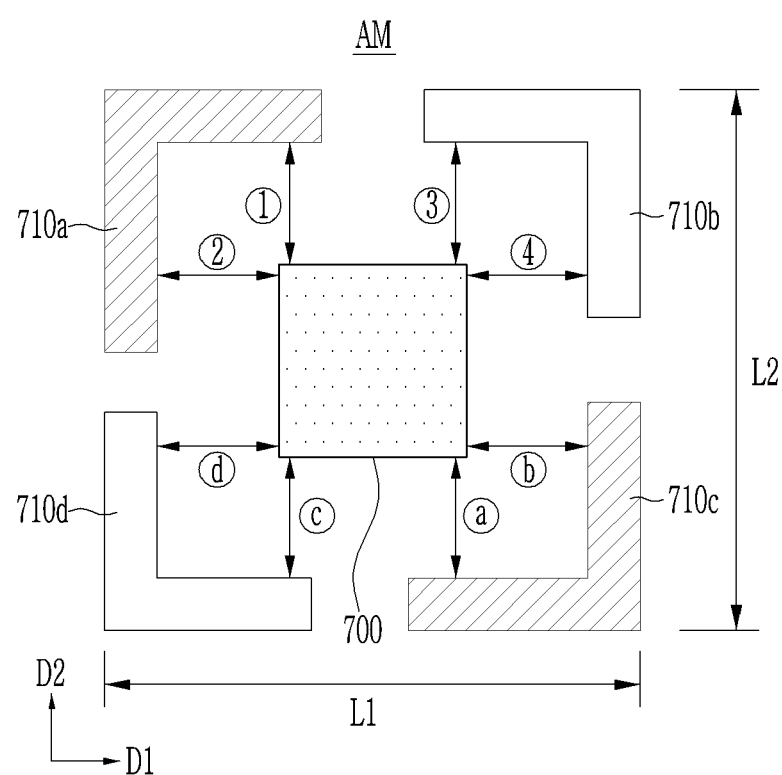
FIG. 3 shows an alignment mark.

FIG. 3 shows only an alignment mark AM. Referring to FIG. 3, the alignment mark AM includes a quadrangular-shaped center portion 700 and a plurality of measurement portions 710a, 710b, 710c, and 710d that surround the center portion 700.

The first measurement portion 710a and the third measurement portion 710c are formed simultaneously with a patterning process of a display area DA by a first mask A. In addition, the second measurement portion 710b and the fourth measurement portion 710d are formed simultaneously with a patterning process of the display area DA by a second mask B. Thus, a difference between a distance from the first measurement portion 710a to the center portion 700 and a distance from the third measurement portion 710c to the center portion 700, and a difference between a distance from the second measurement portion 710b to the center portion 700 and a distance from the fourth measurement portion 710d to the center portion 700, are compared to accurately measure an alignment error of the mask.

The alignment mark AM shown in FIG. 3 is an alignment mark of a display device where misalignment does not occur. In this case, a value obtained by subtracting a distance (ⓑ) from the third measurement portion 710c to the center portion 700 in a first direction D1 from a distance (②) from the first measurement portion 710a to the center portion 700 in the first direction D1 and a value obtained by subtracting a distance (ⓓ) from the fourth measurement portion 710d to the center portion 700 in the first direction D1 from a distance (④) from the second measurement portion 710b to the center portion 700 in the first direction D1 are the same.

That is, in FIG. 3, ②-ⓑ=④-ⓓ, and in this case, it can be determined that the first mask and the second mask are aligned without an error in the first direction D1. Substantially, the masks are considered as being aligned without an error when a difference between a value of ②-ⓑ and a value of ④-ⓓ is less than 0.8 μm. That is, in the display device according to the present exemplary embodiment, a difference between the value of ②-ⓑ and the value of ④-ⓓ of the alignment mark AM may be about −0.8 μm to about 0.8 μm.

Similarly, a value obtained by subtracting a distance ⓐ between the third measurement portion 710c and the center portion 700 in the second direction D2 from a distance ① between the first measurement portion 710a and the center portion 700 in the second direction D2 equals a value obtained by subtracting a distance ⓒ between the fourth measurement portion 710d and the center portion 700 in the second direction D2 from a distance ③ between the second measurement portion 710b and the center portion 700 in the second direction.

That is, in FIG. 3, ①-ⓐ=③-ⓒ, and in this case, the first mask and the second mask area are determined to be aligned without an error in the second direction D2. Substantially, it is determined that a misalignment does not occur when a difference between the value of ①-ⓐ and the value of ③-ⓒ is less than 0.8 μm. That is, in the display device according to the present exemplary embodiment, the value of ①-ⓐ and the value of ③-ⓒ may be −0.8 μm to 0.8 μm.

Accordingly, when ②-ⓑ=④-ⓓ and ①-ⓐ=③-ⓒ, the first mask and the second mask are determined to be aligned without an error in the first direction D1 and the second direction D2. In addition, even when a difference between a value of ②-ⓑ and a value of ④-ⓓ is −0.8 μm to 0.8 μm and a difference between a value of ①-ⓐ and a value of ③-ⓒ is −0.8 μm to 0.8 μm, the first mask and the second mask are determined to be aligned without an error.

In FIG. 3, a size L1 of the alignment mark AM in the first direction D1 may be 15 μm to 30 μm. In addition, a size L2 of the alignment mark AM in the second direction D2 may be 15 um to 30 μm.

Figure 4:
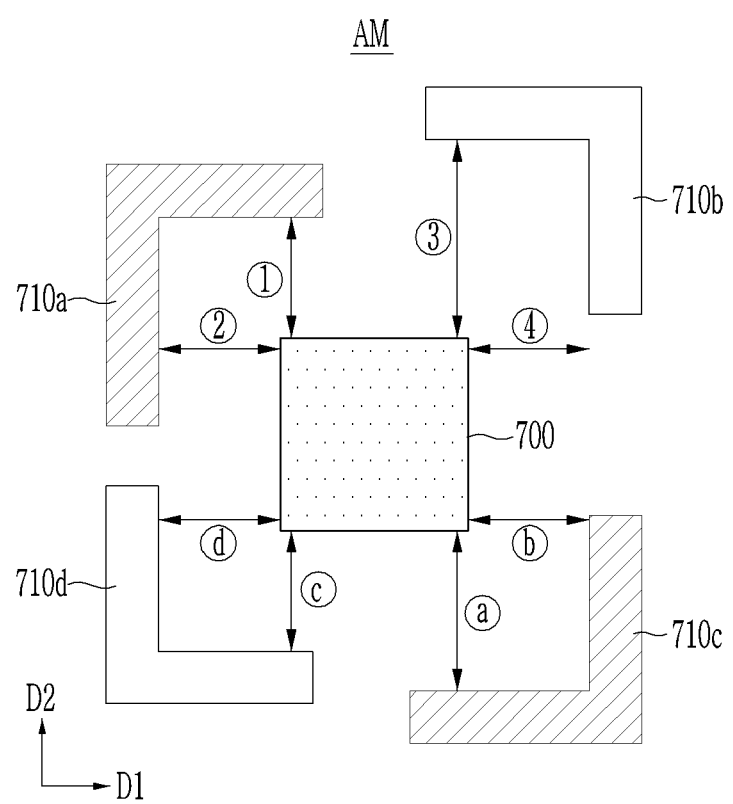
FIG. 4 and FIG. 5 show a shape of the alignment mark when the first mask and the second mask are misaligned.
Figure 5:
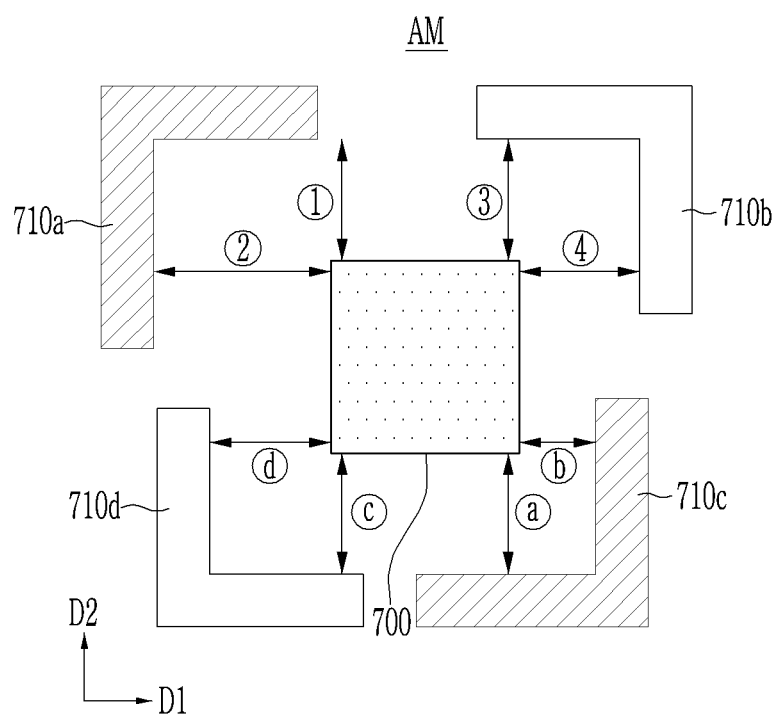

FIG. 4 and FIG. 5 show a shape of the alignment mark when the first mask and the second mask are misaligned.

In the alignment mark shown in FIG. 4, ①-ⓐ<③-ⓒ. Thus, the second mask used in forming of the second measurement portion 710b and the fourth measurement portion 710d is determined to be misaligned in the second direction D2. In addition, the degree of misalignment can be specifically determined through comparison of the value of ①-ⓐ and the value of ③-ⓒ.

The alignment mark shown in FIG. 5 is ②-ⓑ>④-ⓓ. Thus, a first mask used in forming of the first measurement portion 710a and the second measurement portion 710c are determined to be misaligned in the first direction D1. Specifically, the degree of misalignment can be specifically determined through comparison of the value of ②-ⓑ and the value of ④-ⓓ.

In FIG. 1 to FIG. 5, the quadrangular-shaped center portion 700 and the L-shaped measurement portions 710a, 710b, 710c, and 710d are shown, but the shape of the alignment mark AM is not limited thereto.

The measurement portions may have any shape as long as the distances ①, ②, ③, ④, ⓐ, ⓑ, ⓒ, and ⓓ shown in FIG. 3 with respect to the center portion 700 can be measured. The distances ①, ②, ⓐ, and ⓑ are distances between each portion of the measurement portions formed through the same process as the first mask A, and the distances ③, ④, ⓒ, and ⓓ are distances between each portion of the measurement portions formed through the same process as the second mask B and the center portion 700.

Figure 6:
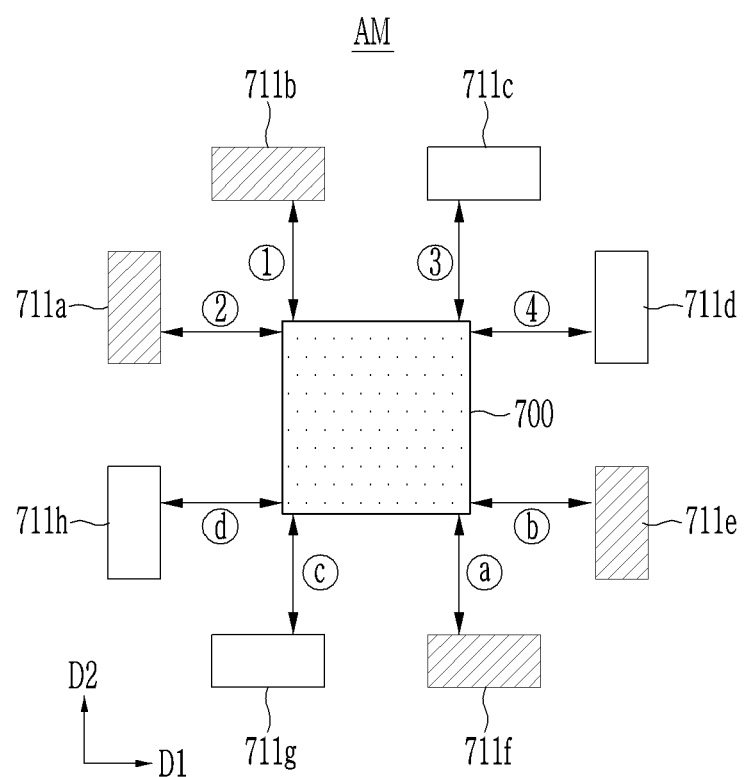
FIG. 6 shows an alignment mark according to another exemplary embodiment.

For example, the alignment mark AM may have a shape as shown in FIG. 6. FIG. 6 shows an alignment mark according to another exemplary embodiment. Referring to FIG. 6, the alignment mark AM includes a first measurement portion 711a, a second measurement portion 711b, a third measurement portion 711c, a fourth measurement portion 711d, a fifth measurement portion 711e, a sixth measurement portion 711f, a seventh measurement portion 711g, and an eighth measurement portion 711h that surround a quadrangular-shaped center portion 700. The first measurement portion 711a, the second measurement portion 711b, the fifth measurement portion 711e, and the sixth measurement portion 711f may be formed through the same process, such as a patterning process by a first mask, and the third measurement portion 711c, the fourth measurement portion 711d, the seventh measurement portion 711g, and the eighth measurement portion 711h may be formed through the same process, such as a patterning process by a second mask.

In this case, similar to FIG. 3, an alignment error in the first direction D1 can be determined through comparison between a value of ②-ⓑ and a value of ④-ⓓ, and an alignment error in the second direction D2 can be determined through comparison between a value of ①-ⓐ and a value of ③-ⓒ.

Figure 7:
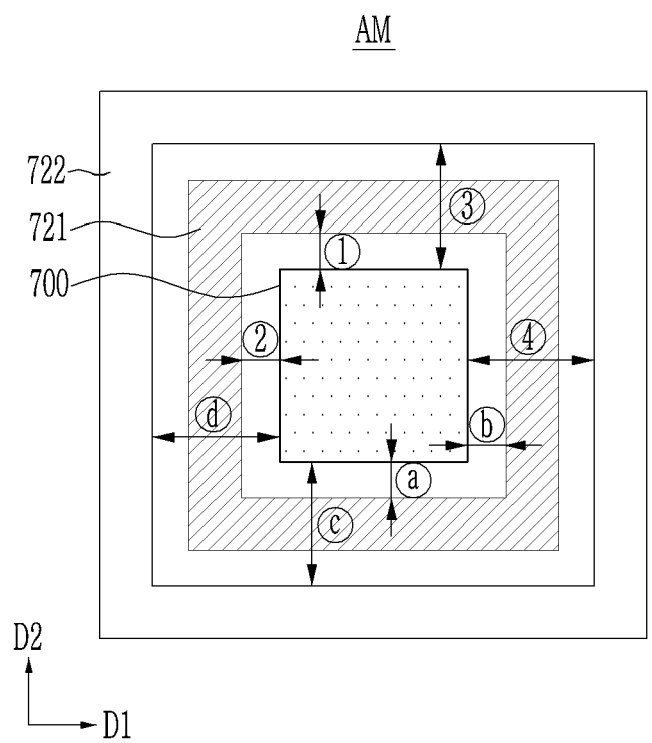
FIG. 7 shows a shape of an alignment mark according to another exemplary embodiment of the present invention.

FIG. 7 shows a shape of an alignment mark AM according to another exemplary embodiment of the present invention. Referring to FIG. 7, an alignment mark AM according to the present exemplary embodiment includes a center portion 700, a first measurement portion 721 that surrounds the center portion 700, and a second measurement portion 722 that surrounds the first measurement portion 721.

The first measurement portion 721 is formed through the same process as a patterning process by a first mask, and the second measurement portion 722 is formed through the same process as a patterning process by a second mask. In the exemplary embodiment of FIG. 7, similar to FIG. 3, an alignment error in a first direction D1 can be determined through comparison between a value of ②-ⓑ and a value of ④-ⓓ, and an alignment error in a second direction D2 can be determined through comparison between a value of ①-ⓐ and a value of ③-ⓒ.

Figure 8:
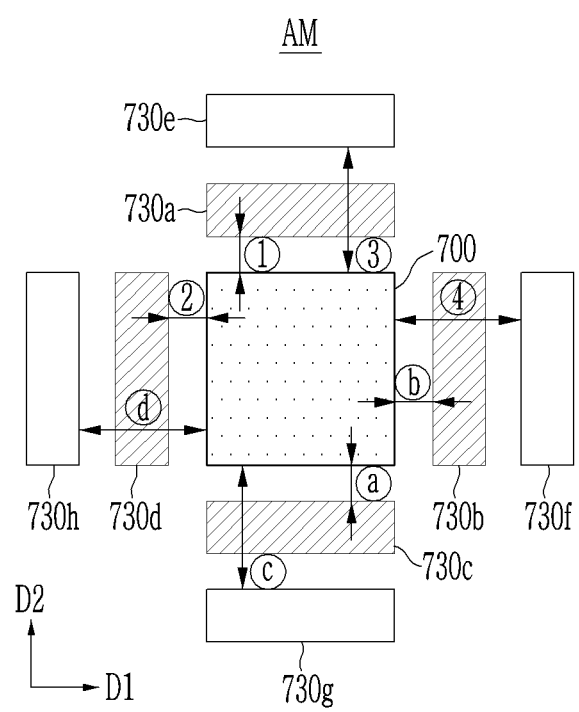
FIG. 8 shows a shape of an alignment mark according to another exemplary embodiment of the present invention.

FIG. 8 shows a shape of an alignment mark AM according to another exemplary embodiment of the present invention. Referring to FIG. 8, an alignment mark AM according to the present exemplary embodiment includes a center portion 700, a first measurement portion 730a, a second measurement portion 730b, a third measurement portion 730c, and a fourth measurement portion 730d that surround the center portion 700. In addition, the alignment mark AM includes a fifth measurement portion 730e, a sixth measurement portion 730f, a seventh measurement portion 730g, and an eighth measurement portion 730h that surround the first measurement portion 730a, the second measurement portion 730b, the third measurement portion 730c, and the fourth measurement portion 730d.

In the exemplary embodiment of FIG. 8, similar to FIG. 3, an alignment error in a first direction D1 can be determined through comparison between a value of ②-ⓑ and a value of ④-ⓓ, and an alignment error in a second direction D2 can be determined through comparison between a value of ①-ⓐ and a value of ③-ⓒ.

Figure 9:
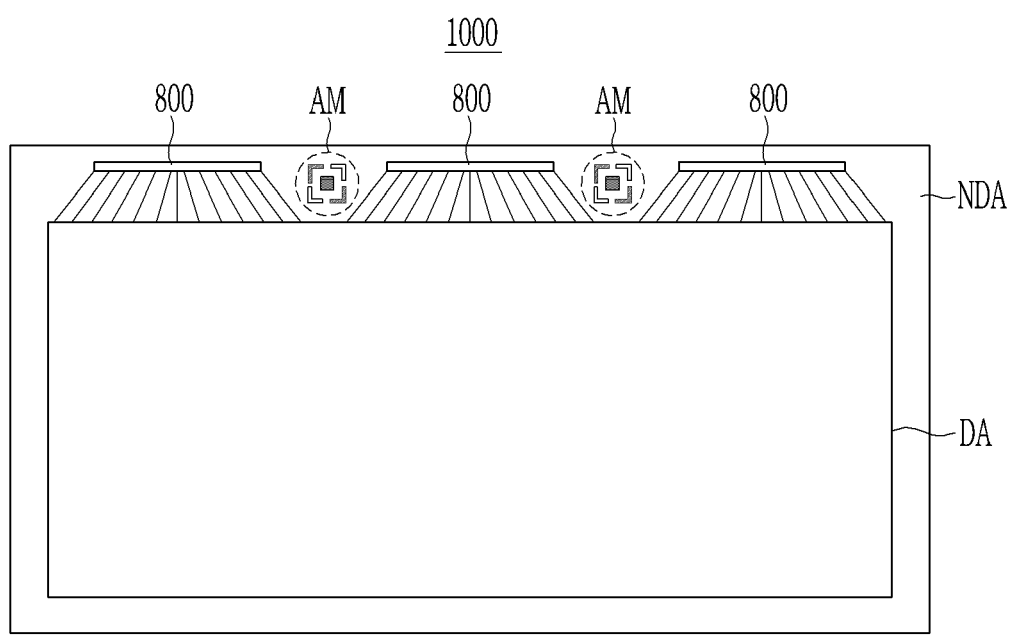
FIG. 9 shows a specific location of the alignment mark.

Such an alignment mark AM may be disposed in the non-display area NDA of the display panel 1000. Specifically, the alignment mark AM may be disposed between a plurality of drivers 800 of the non-display area NDA. FIG. 9 shows a specific location of the alignment mark AM.

Referring to FIG. 9, the plurality of drivers 800 are disposed in the non-display area NDA, and wires are stretched in a fan-out form from the drivers 800, and are thus connected to the display area DA. Thus, as shown in FIG. 9, the alignment marks AM may be disposed in spaces between the plurality of drivers 800 and the wires connected with the drivers 800.

The alignment marks may be disposed in areas where a plurality of masks used in manufacturing of the display area DA are overlapped with each other. Specifically, one or more alignment marks AM may be disposed in a non-display area NDA that neighbors the ¼ point to the ¾ point in a width of the display area DA in the first direction. This is because when two or more masks are used, a mask overlapped area is located at the ¼ to ¾ point of the display area DA in the first direction. In FIG. 9, the alignment marks AM are disposed only at one side of the display area DA, but the alignment marks AM may be disposed at opposite sides, with the display area DA therebetween.

In addition, in FIG. 9, only one alignment mark AM is disposed per mask overlapped area, but the number of alignment marks is not limited thereto.

Figure 10:
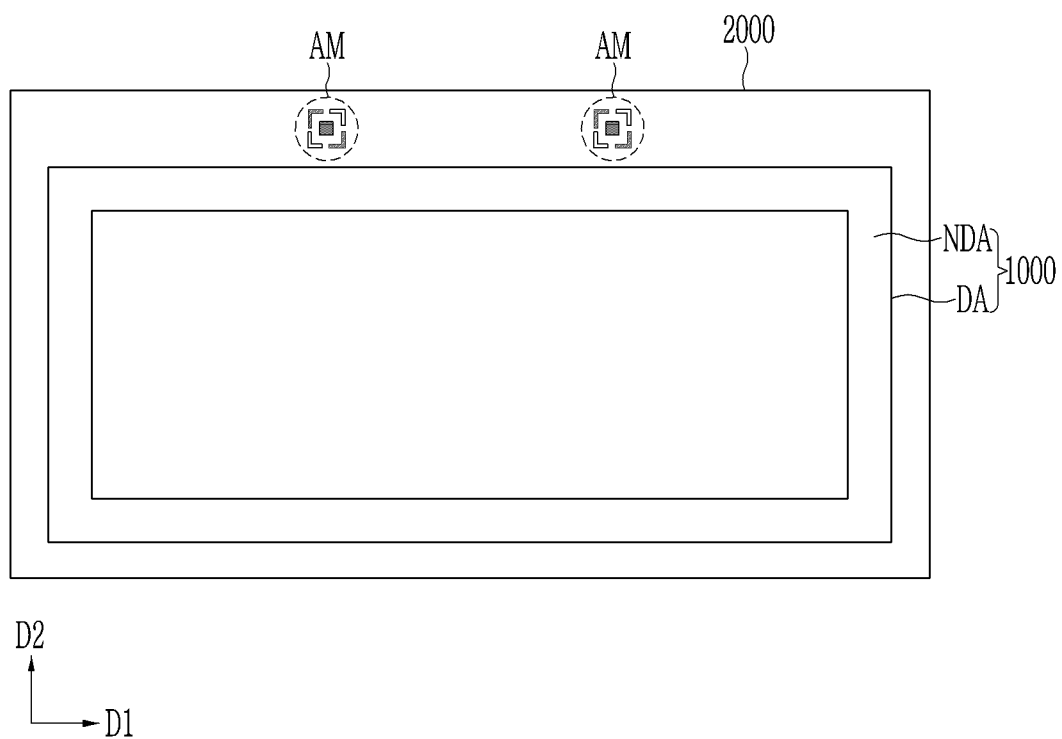
FIG. 10 shows a location of an alignment mark according to another exemplary embodiment of the present invention.

In FIG. 9, the alignment mark AM is disposed in the display panel 1000, but the alignment mark AM may be disposed outside the display panel 1000. FIG. 10 shows a mother substrate 2000 in which alignment marks AM are disposed outside a display panel 1000. Referring to FIG. 10, alignment marks AM are disposed in a mother substrate 2000 where a plurality of display panels 1000 are manufactured, and may not be disposed on the display panel 1000. In this case, the alignment marks are used to determine alignment of masks and then removed through a cutting process and the like. Thus, the alignment marks may not be disposed on a final display panel 1000.

Next, a method for manufacturing a display device according to an exemplary embodiment of the present invention will be described with reference to the accompanying drawings. FIG. 11 to FIG. 15 are cross-sectional views of a manufacturing process of a display device according to an exemplary embodiment of the present invention.

First, a substrate 110 that includes a display area DA and a non-display area NDA is prepared. The display area DA is an area where a transistor, a pixel electrode, and the like are located.

Figure 12:
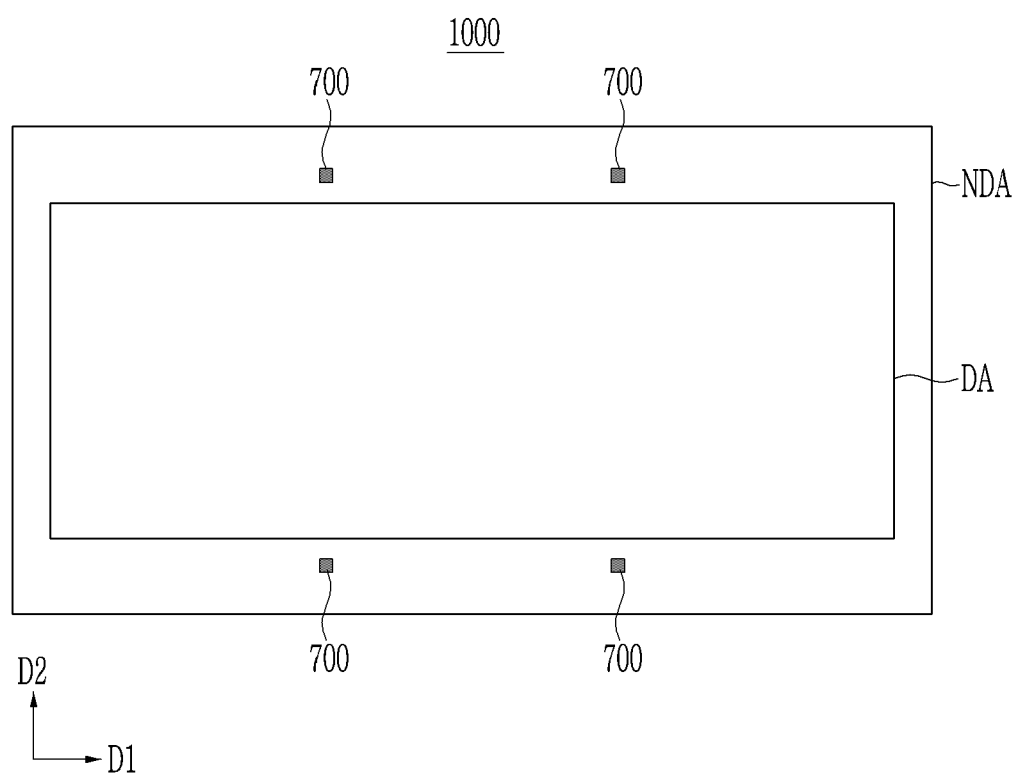

Referring to FIG. 12, center portions 700 are formed in the non-display area NDA that is adjacent to the display area DA. In this case, the center portions 700 may be formed through the same process as that for forming a gate line in the display area DA. Thus, the center portion 700 may include the same material as the gate line in the display area DA.

Areas where the center portions 700 are formed are those where masks are overlapped with each other in the subsequent process. Thus, exact locations of the center portions 700 may be changed depending on the number of masks used in a process for manufacturing one layer of a display panel. Specifically, when two masks are used in the process for forming one layer of the display panel, the center portion 700 may be located near the ½ point of the display panel in the first direction D1. In addition, when three masks are used in the process for forming one layer of the display panel, the center portions 700 may be located near the ⅓ point and the ⅔ point, respectively, in the first direction D1 of the display panel. Accordingly, when two or more masks are used, one or more center portions 700 may be located between the ¼ point and the ¾ point of the display panel in the first direction D1.

Figure 13:
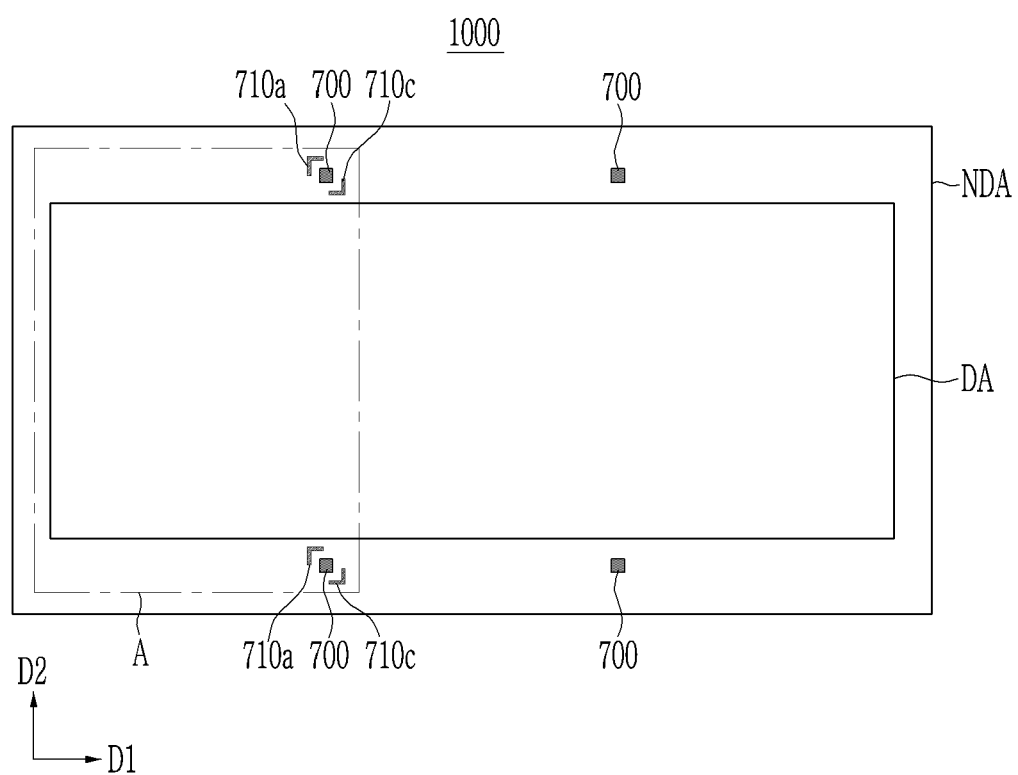

Next, referring to FIG. 13, one layer of the display area DA is formed by using a first mask A. The layer of the display area formed in this stage may be a conductive layer including a data line. Alternatively, the layer may be an electrode layer including a pixel electrode. In this case, a first measurement portion 710*a* and a third measurement portion 710*c* are formed together at corners of each of the center portion 700. The first measurement portion 710*a* and the third measurement portion 710*c* include the same material as a layer patterned in the display area by using the first mask A. That is, when a data line is patterned in the display area DA by using the first mask A, the first measurement portion 710*a* and the third measurement portion 710*c* include a data line material, and when a pixel electrode is patterned in the display area DA by using the first mask A, the first measurement portion 710*a* and the third measurement portion 710*c* include a pixel electrode material.

FIG. 13 exemplarily illustrates a structure in which the first measurement portion 710*a* and the third measurement portion 710*c* are L-shaped, but the inventive concepts are not so limited. The first measurement portion 710*a* and the third measurement portion 710*c* may have various shapes while having a constant distance from the center portion 700.

Figure 14:
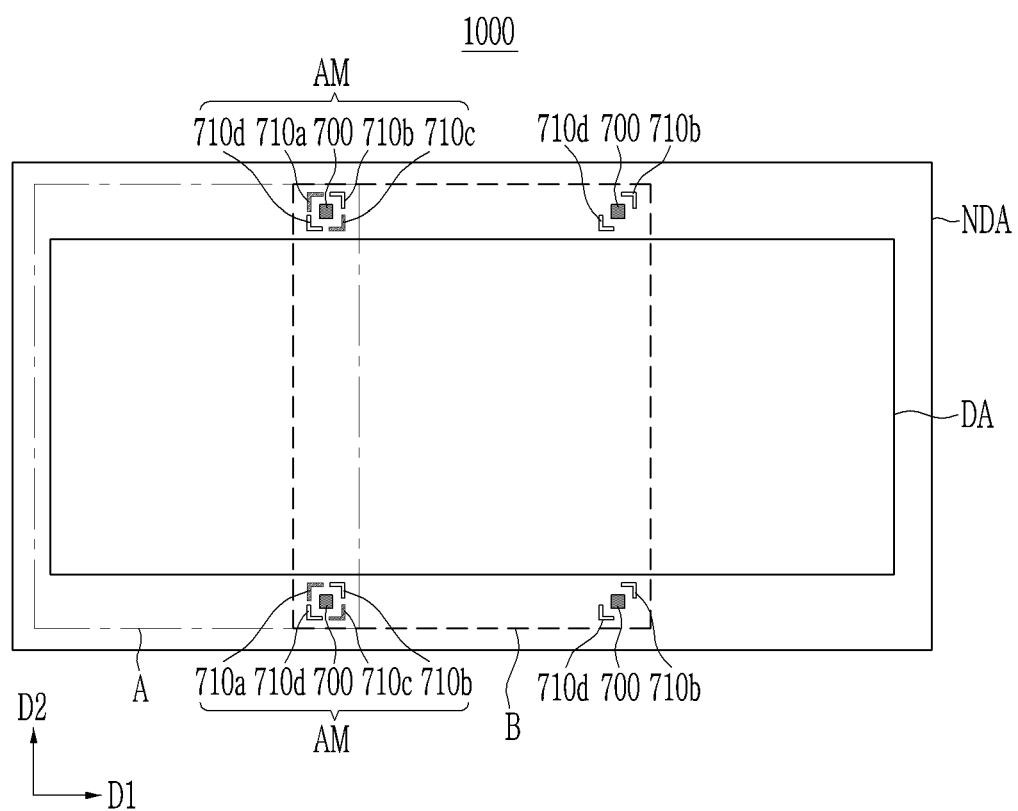

Next, referring to FIG. 14, one layer is formed in the display area by using the second mask B, and the second measurement portion 710*b* and the fourth measurement portion 710*d* are simultaneously formed. In this case, an area where the second measurement portion 710*b* and the fourth measurement portion 710*d* are formed is an area where the first mask A and the second mask B are overlapped with each other. A layer formed in the display area by the second mask B is the same as the layer formed by the first mask A. Thus, the second measurement portion 710*b* and the fourth measurement portion 710*d* also include the same material as the first measurement portion 710*a* and the third measurement portion 710*c*. Referring to FIG. 14, the second measurement portion 710*b* and the fourth measurement portion 710*d* may be formed at corners where the first measurement portion 710*a* and the third measurement portion 710*c* are formed among corners of the quadrangular-shaped center portion 700.

Figure 15:
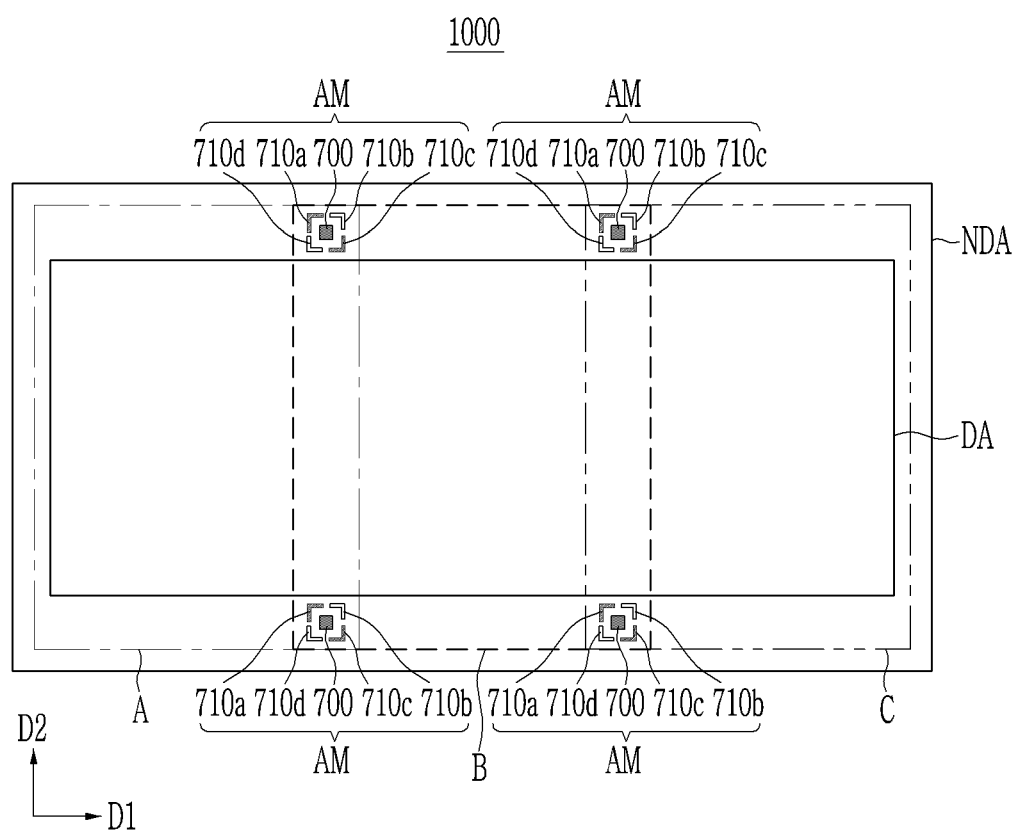

Next, referring to FIG. 15, one layer is formed in the display area by using the third mask C, and the first measurement portion 710*a* and the third measurement portion 710*c* are simultaneously formed. In this case, the layer formed by the third mask C is the same as the layer formed by the first mask A and the second mask B. Through such a process, an alignment mark AM, including a center portion 700 and measurement portions 710*a*, 710*b*, 710*c*, and 710*d*, is formed.

FIG. 11 to FIG. 15 show a process for manufacturing the display device where the alignment marks are disposed in the non-display area of the display panel. Referring to FIG. 16 to FIG. 20, a process for manufacturing a display device in which alignment marks are disposed outside a display panel will be described. FIG. 16 to FIG. 20 show manufacturing processes of a display device according to an exemplary embodiment.

Figure 16:
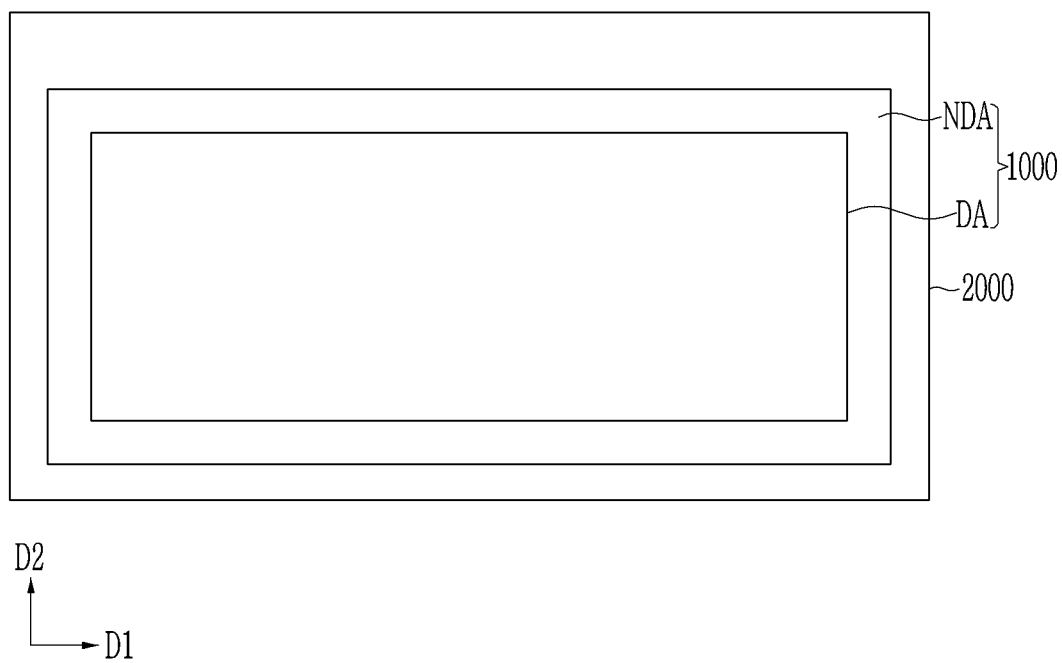
FIGS. 16, 17, 18, 19, and 20 show manufacturing processes of a display device according to an exemplary embodiment of the present invention.

Referring to FIG. 16, a mother substrate 2000 where a display panel 1000 that includes a display area DA and a non-display area NDA is prepared. FIG. 16 illustrates only one display panel 1000 for convenience of description, but a plurality of display panels 1000 may be disposed in the mother substrate 2000.

Figure 17:
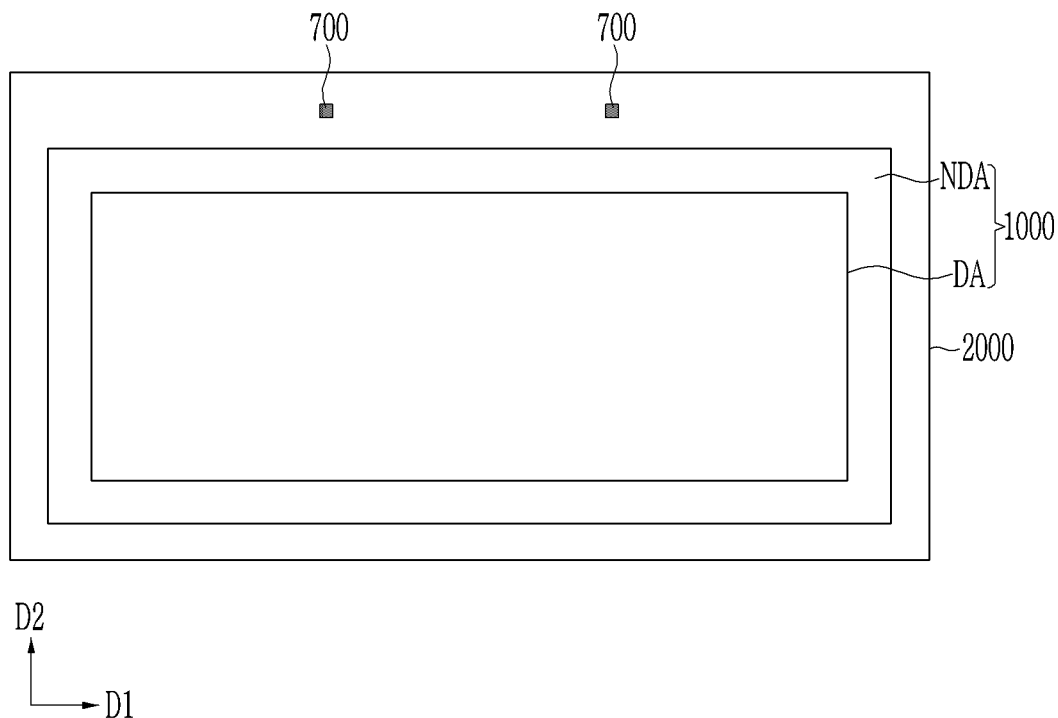

Next, referring to FIG. 17, center portions 700 are formed. In this case, the center portions 700 may be formed through the same process as that for forming a gate line in the display area DA. Thus, the center portion 700 may include the same material as the gate line in the display area DA.

A location where the center portion 700 is formed is an area where masks are overlapped with each other. When two or more masks are used in the display panel 1000, one or more center portions 700 may be disposed between the ¼ point and the ¾ point of the display panel 1000 in a first direction.

Figure 18:
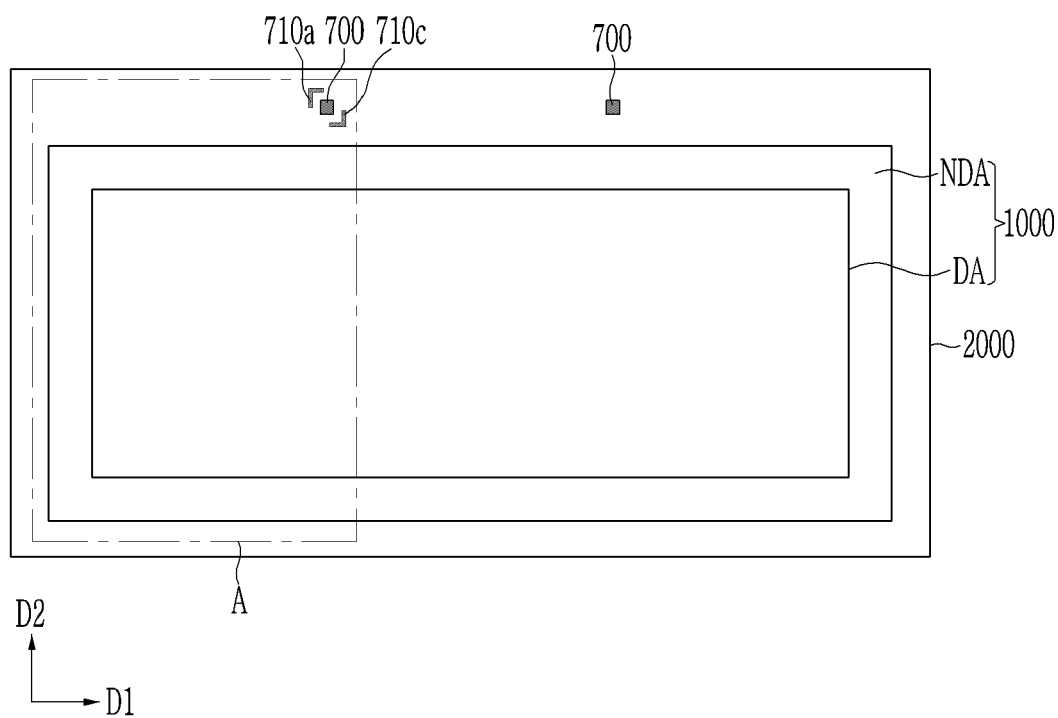

Next, referring to FIG. 18, one layer is formed in the display area DA by using a first mask A. The layer formed in this case may be a data line or a pixel electrode. In this case, a first measurement portion 710 and a third measurement portion 710*c* are formed together at corners of the center portion 700. The first measurement portion 710*a* and the third measurement portion 710*c* include the same material as the layer patterned in the display area DA by using the first mask A.

Figure 19:
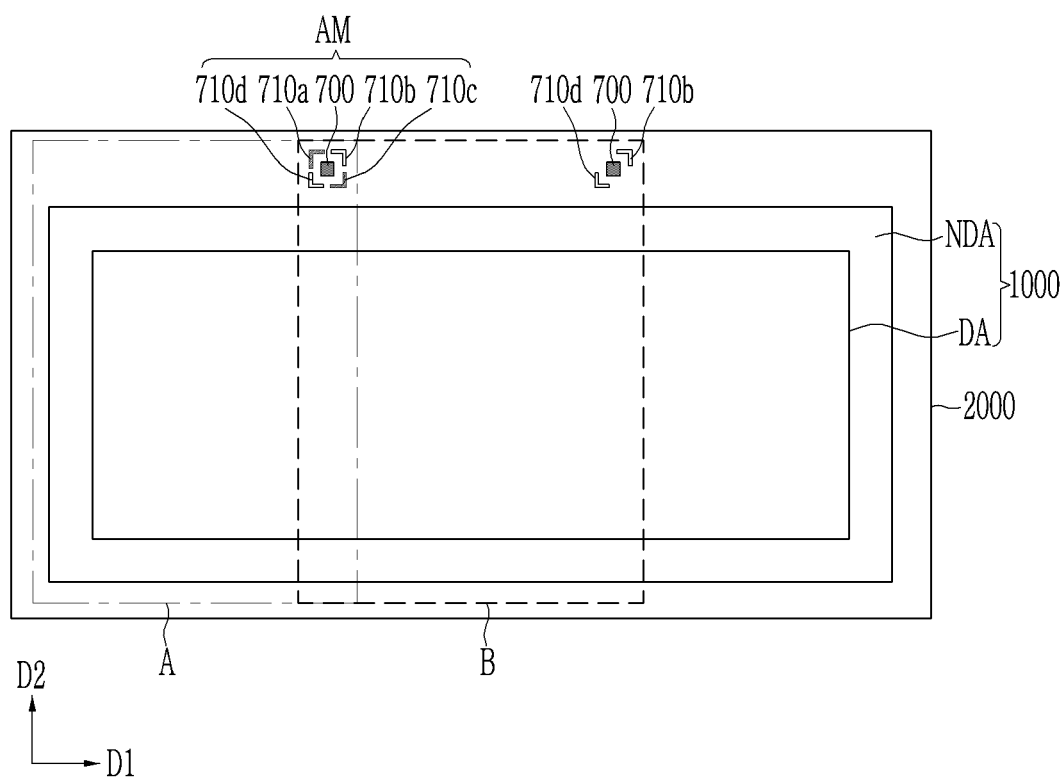

Next, referring to FIG. 19, one layer is formed in the display area DA by using a second mask B, and a second measurement portion 710*b* and a fourth measurement portion 710*d* are simultaneously formed. In this case, an area where the second measurement portion 710*b* and the fourth measurement portion 710*d* are formed is an area where the first mask A and the second mask B are overlapped with each other. The second measurement portion 710*b* and the fourth measurement portion 710*d* also include the same material as the first measurement portion 710*a* and the third measurement portion 710*c*. Referring to FIG. 19, the second measurement portion 710*b* and the fourth measurement portion 710*d* may be formed in an area where the first measurement portion 710*a* and the third measurement portion 710*c* are not formed among corners of the quadrangular-shaped center portion 700.

Figure 20:
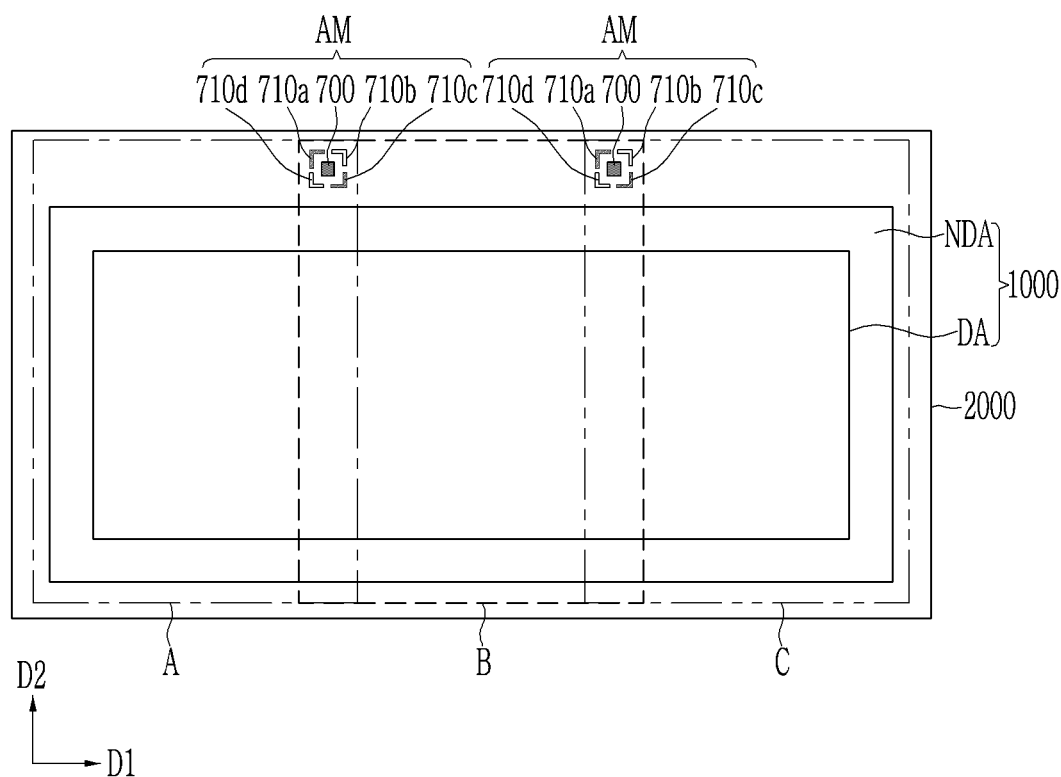

Next, referring to FIG. 20, one layer is formed in the display area DA by using a third mask C, and the first measurement portion 710*a* and the third measurement portion 710*c* are simultaneously formed. In this case, the layer formed by the third mask C is also the same as the layers formed by the first mask A and the second mask B. Through such a process, an alignment AM including the center portion 700 and the measurement portions 710*a*, 710*b*, 710*c*, and 710*d* is formed.

Next, a display device can be formed by cutting the display panel 1000 in the mother substrate 2000. Thus, the alignment marks are not disposed in the finally manufactured display panel 1000. That is, the alignment marks can be disposed only during a manufacturing process.

In FIG. 11 to FIG. 15 and FIG. 16 to FIG. 20, three masks are used in the manufacturing process, but the alignment marks AM can be formed through the same process even if the number of masks is changed. That is, the number of alignment marks AM is changed depending on the number of masks, and a specific formation principle is the same as that described with reference to FIG. 11 to FIG. 15 and FIG. 16 to FIG. 20. In addition, in FIG. 11 to FIG. 15 and FIG. 16 to FIG. 20, the manufacturing process is described using an example of a structure in which the alignment mark AM has the same shape as the alignment mark shown in FIG. 1, but the alignment mark AM may be manufactured through a process similar to that shown in FIG. 11 to FIG. 15 and FIG. 16 to FIG. 20 even when the alignment mark has the shape shown in FIG. 6 to FIG. 8. That is, a part of a measurement portion that forms each alignment mark is formed through the same process as that of a first mask, and another part may be formed through the same process as that of a second mask.

Next, a pixel in a display device of a display panel will be described in detail with reference to the drawings.

Figure 21:
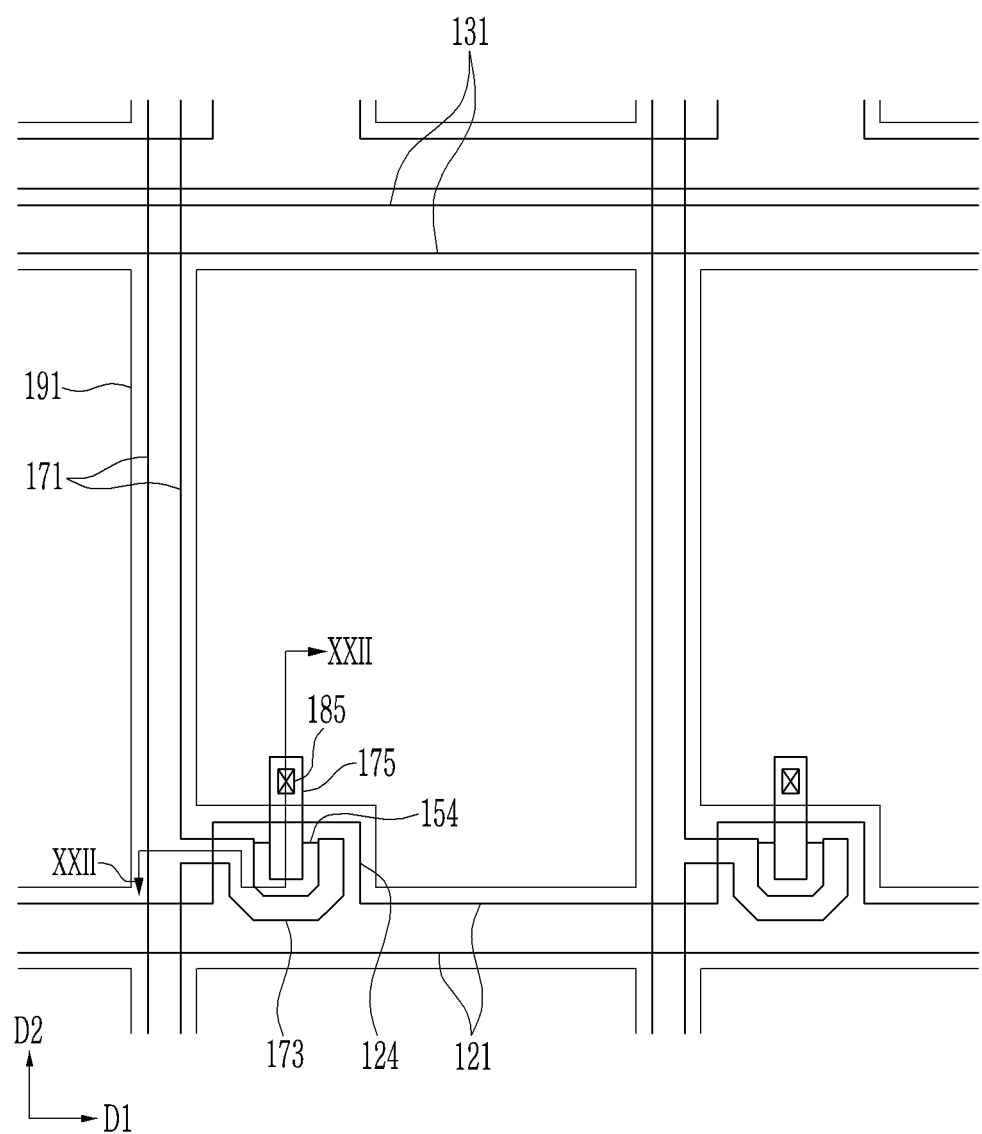
FIG. 21 is a pixel layout view of a display area according to an exemplary embodiment.
Figure 22:
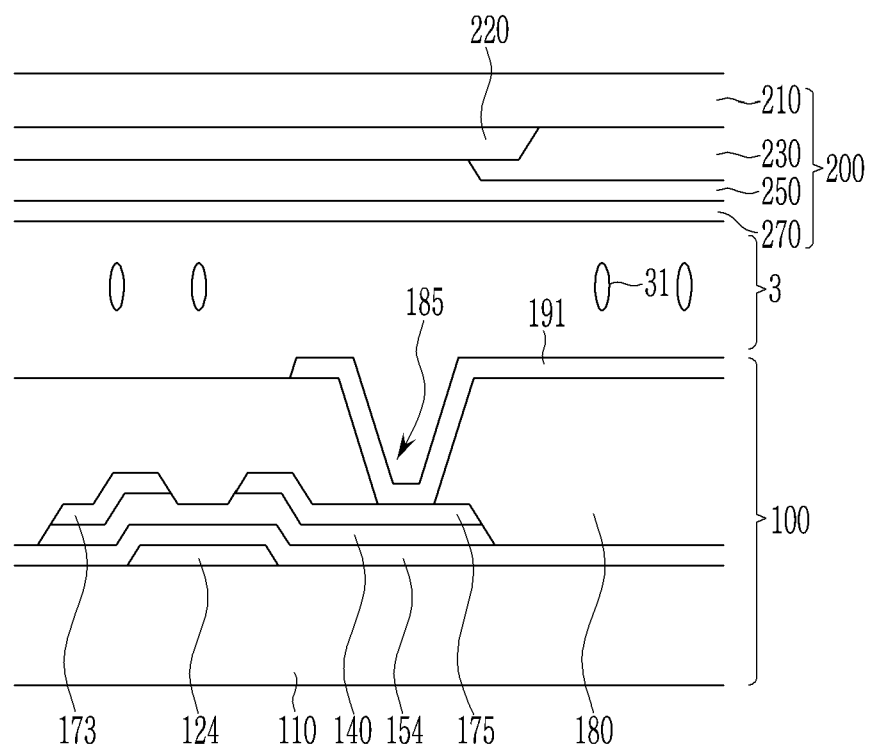
FIG. 22 is a cross-sectional view of the display device of FIG. 21, taken along the line XXII-XXII'.

FIG. 21 is a pixel layout view of a display area according to an exemplary embodiment, and FIG. 22 is a cross-sectional view of the display device of FIG. 21, taken along the line XXII-XXII'.

Referring to FIG. 21 and FIG. 22, the display panel includes a first substrate 100, a second substrate 200 that overlaps the first substrate 100, and a liquid crystal layer 3 that is disposed between the first substrate 100 and the second substrate 200 and includes liquid crystal molecules 31.

First, the first substrate 100 will be described. A gate conductor that includes gate lines 121 and a gate electrode 124 is disposed on one side of a first base substrate 110 that is made of transparent glass or plastic.

The gate line 121 may extend in a first direction D1. The gate conductor may include various metals or conductors, and may be formed in a multilayered structure. A gate insulation layer 140 is disposed between the gate conductor and the liquid crystal layer 3. The gate insulation layer 140 may include an inorganic insulating material.

A semiconductor layer 154 is disposed on one side of the gate insulation layer 140.

Data lines 171 are disposed between the semiconductor layer 154 and the liquid crystal layer 3, and extend in a second direction DR2 and thus, cross the gate lines 121. A source electrode 173 extends from the data line 171 and thus, may overlap the gate electrode 124. A drain electrode 175 is separated from the data lines 171 and, as shown in FIG. 21, the drain electrode 175 may be formed in the shape of a bar extending toward a center of the source electrode 173.

A part of the semiconductor layer 154 may not overlap the data line 171 and the drain electrode 175 in an area between the source electrode 173 and the drain electrode 175. The semiconductor layer 154 may have substantially the same planar shape as the data line 171 and the data electrode 175, excluding such a non-overlapped portion.

One gate electrode 124, one source electrode 173, and one drain electrode 175 form one thin film transistor together with the semiconductor layer 154, and a channel of the thin film transistor is an area for the semiconductor layer 154 between the source electrode 173 and the drain electrode 175.

A passivation layer 180 is disposed between the source electrode 173 and drain electrode 175 and the liquid crystal layer 3. The passivation layer 180 may include an inorganic insulation material, such as a silicon nitride or a silicon oxide, an organic insulation material, a low dielectric constant insulation material, and the like.

The passivation layer 180 includes a contact hole 185 that overlaps a part of the drain electrode 175.

A first electrode 191 is disposed between the passivation layer 180 and the liquid crystal layer 3. The first electrode 191 is physically and electrically connected with the drain electrode 175 through the contact hole 185, and receives a data voltage from the drain electrode 175. The first electrode 191 may be a pixel electrode.

The second substrate 200 includes a second base substrate 210, a light blocking member 220, a color filter 230, a planarization layer 250, and a second electrode 270.

The light blocking member 220 and the color filter 230 are disposed in the second base substrate 210. The light blocking member 220 may extend in the second direction D2, while overlapping the data line 171. Although it is not illustrated, the light blocking member 220 may further include a horizontal portion that extends in the first direction D1 while overlapping the gate line 121. However, the light blocking member 220 can be omitted.

Next, the planarization layer 250 that covers the light blocking member 220 and the color filter 230 is disposed. The planarization layer 250 may be omitted depending on exemplary embodiments. The second electrode 270 is disposed, while overlapping the planarization layer 250. The second electrode 270 may be a common electrode.

Hereinabove, the display area DA has been exemplarily described as a liquid crystal display (LCD), but the display area DA may be a display device that includes an organic light emitting element.

Figure 23:
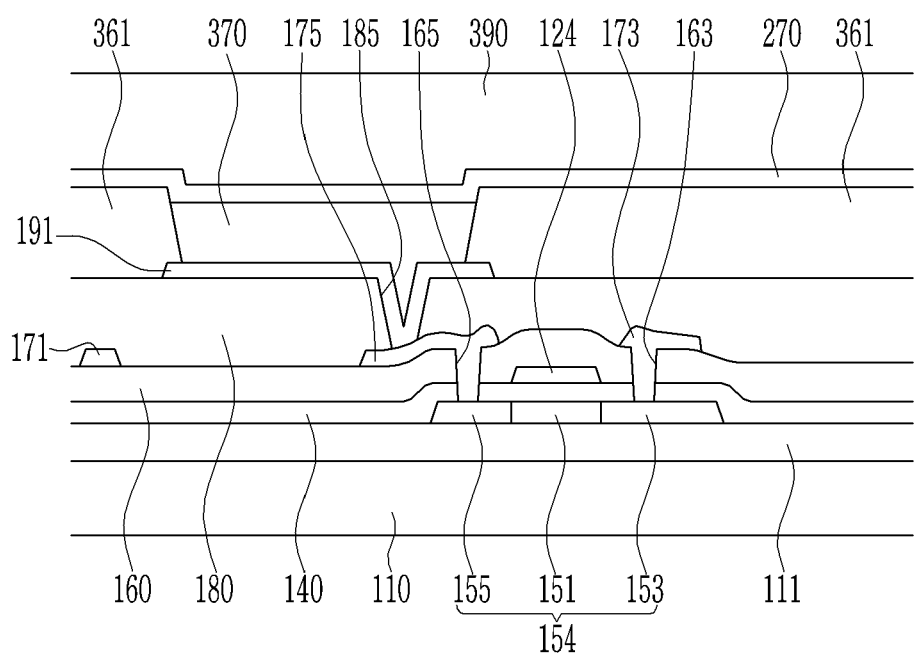
FIG. 23 is a cross-sectional view of a display panel according to an exemplary embodiment of the present invention.

FIG. 23 is a cross-sectional view of a display panel according to an exemplary embodiment of the present invention. Referring to FIG. 23, a buffer layer 111 that is made of a silicon oxide or a silicon nitride is disposed on a first base substrate 110.

A semiconductor layer is disposed on the buffer layer 111. The semiconductor layer 154 includes a source area 153, a drain area 155, and a channel area 151. The source area 153 and the drain area 155 are doped with a p-type impurity, and the channel area 151 is disposed between the source area 153 and the drain area 155.

A gate insulation layer 140 is disposed on the semiconductor layer 154 and the buffer layer 111, and may include a silicon oxide or a silicon nitride. The gate electrode 124 is disposed on the gate insulation layer 140, while overlapping the channel area 151 of the semiconductor layer 154.

An interlayer insulation layer 160 is disposed on the gate electrode 124 and the gate insulation layer 140. The interlayer insulation layer 160 includes a first contact hole 165 and a second contact hole 163.

A data conductor that includes a data line 171, a source electrode 173, and a drain electrode 175 is disposed on the interlayer insulation layer 160.

The drain electrode 175 is connected with the drain area 155 through the first contact hole 165. In addition, the source electrode 173 is connected with the source area 153 through the second contact hole 163.

A passivation layer 180 is disposed on the data conductors 171, 173, and 175 and the interlayer insulation layer 160, and includes a contact hole 185.

A first electrode 191 is disposed on the passivation layer. The first electrode 191 may be a pixel electrode. The first electrode 191 is connected with the drain electrode 175 through the contact hole 185. A barrier rib 361 is disposed on the passivation layer 180. A light emitting element layer 370 is disposed, while overlapping the first electrode 191, and a second electrode 270 is disposed to be overlapped with the light emitting element layer 370. The second electrode 270 may be a common electrode.

In this case, the first electrode 191 may be an anode, which is a hole injection electrode, and the second electrode 270 may be a cathode, which is an electron injection electrode. However, the inventive concepts are not so limited, and the first electrode 191 may be a cathode and the second electrode 270 may be an anode depending on a driving method of the display device.

The light emitting element layer 370 may include an emission layer, an electron transport layer, and a hole transport layer.

An encapsulation layer 390 is disposed while overlapping the second electrode 270. The encapsulation layer 390 may include an organic material or an inorganic material, and an organic material and an inorganic material may be alternately stacked. The encapsulation layer 390 can protect the display device from external moisture, heat, and other contaminants.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, comprising:
   preparing a substrate having a display area and a non-display area;
   forming a center portion in the non-display area through a process for forming a first conductive layer in the display area; and
   forming a second conductive layer in the display area, and forming a first measurement portion and a second measurement portion that surround the center portion through a process for forming the second conductive layer;
   wherein:
   the first measurement portion and the second measurement portion are separated from each other;
   the first measurement portion and the second measurement portion are disposed diagonally with the center portion in between;
   the center portion comprises the same material as a gate line or a data line of the display area;
   the first measurement portion and the second measurement portion comprise the same material as the data line or a pixel electrode material of the display area; and
   the center portion, the first measurement portion, and the second measurement portion are disposed on a same layer.

2. The method of claim 1, wherein:
   the center portion is formed in the shape of a quadrangle;
   the first measurement portion comprises sides that are in in parallel with a first side and
   the second measurement portion comprises sides that are in parallel with the third side and the fourth side of the quadrangular-shaped center portion, and is disposed adjacent to the third side and the fourth side.

3. The method of claim 1, wherein the center portion and the measurement portions comprise different materials.

4. A method of manufacturing a display device, comprising:
   preparing a substrate having a display area and a non-display area;
   forming a center portion in the non-display area through a process for forming a first conductive layer in the display area;
   forming a second conductive layer in the display area by using a first mask, and forming a first measurement portion and a second measurement portion that surround the center portion through a process for forming the second conductive layer; and
   forming the second conductive layer by using a second mask in the display area, and forming a third measurement portion and a fourth measurement portion that surround the center portion through a process for forming the second conductive layer,
   wherein:
   the center portion is formed in an area where the first mask and the second mask are overlapped with each other; and
   the first measurement portion, the second measurement portion, the third measurement portion, and the fourth measurement portion are separated from each other.

5. The method of claim 4, wherein:
   the center portion is formed in the shape of a quadrangle;
   the first measurement portion comprises sides that are in parallel with a first side and a fourth side of the quadrangular-shaped center portion, and is disposed adjacent to the first side and the fourth side;
   the second measurement portion comprises sides that are in parallel with the first side and a second side of the quadrangular-shaped center portion, and is disposed adjacent to the first side and the second side;
   the third measurement portion comprises sides that are in parallel with the second side and a third side of the quadrangular-shaped center portion, and is disposed adjacent to the second side and the third side; and
   the fourth measurement portion comprises sides that are in parallel with the third side and the fourth side of the quadrangular-shaped center portion, and is disposed adjacent to the third side and the fourth side.

6. The method of claim 4, wherein the center portion and the measurement portions comprise different materials.

7. The method of claim 4, wherein:
   the center portion comprises the same material as a gate line or a data line of the display area; and
   the measurement portions comprise the same material as the data line or a pixel electrode material of the display area.

8. The method of claim 4, wherein a difference between a value obtained by subtracting a distance from the center portion to the third measurement portion in a second direction from a distance from the center portion to the first measurement portion in the second direction, and a value obtained by subtracting a distance from the center portion to the fourth measurement portion in the second direction from a distance from the center portion to the second measurement portion in the second direction, is about −0.8 μm to about 0.8 μm.

9. The method of claim 4, wherein a difference between a value obtained by subtracting a distance from the center portion to the third measurement portion in a first direction from a distance from the center portion to the first measurement portion in the first direction, and a value obtained by subtracting a distance from the center portion to the fourth measurement portion in the first direction from a distance from the center portion to the second measurement portion in the first direction, is about −0.8 μm to about 0.8 μm.

* * * * *